United States Patent
Sakai et al.

(10) Patent No.: US 12,024,107 B2
(45) Date of Patent: Jul. 2, 2024

(54) CONTROL DEVICE

(71) Applicant: DENSO TEN Limited, Kobe (JP)

(72) Inventors: Yuuya Sakai, Kobe (JP); Nobumasa Tokui, Kobe (JP); Takahiro Matsuzaki, Kobe (JP)

(73) Assignee: DENSO TEN Limited, Kobe (JP)

( * ) Notice: Subject to any disclaimer, the term of this patent is extended or adjusted under 35 U.S.C. 154(b) by 274 days.

(21) Appl. No.: 17/463,901

(22) Filed: Sep. 1, 2021

(65) Prior Publication Data

US 2022/0348157 A1 Nov. 3, 2022

(30) Foreign Application Priority Data

Apr. 30, 2021 (JP) ................................. 2021-077520

(51) Int. Cl.
*B60R 21/0132* (2006.01)
*H05K 5/00* (2006.01)
*B60R 21/01* (2006.01)

(52) U.S. Cl.
CPC ....... *B60R 21/0132* (2013.01); *H05K 5/0073* (2013.01); *H05K 5/0078* (2013.01); *B60R 2021/01006* (2013.01); *B60R 2021/01013* (2013.01)

(58) Field of Classification Search
CPC ...... B60R 21/0132; B60R 2021/01006; B60R 2021/01013; B60R 2021/00; B60R 2021/01; H05K 5/0073; H05K 5/0078; H05K 5/0204
See application file for complete search history.

(56) References Cited

U.S. PATENT DOCUMENTS

| | | | | |
|---|---|---|---|---|
| 5,871,229 A | * | 2/1999 | Saito | ................... B60R 21/2165 280/732 |
| 8,899,370 B1 | * | 12/2014 | Ohmoto | .............. B60R 16/0239 180/274 |
| 2002/0149918 A1 | * | 10/2002 | Koyama | .............. H05K 5/0073 361/752 |
| 2003/0232591 A1 | * | 12/2003 | Nanaumi | ................ B60R 21/00 296/187.09 |
| 2012/0247012 A1 | * | 10/2012 | Johnson | ............. A01G 13/0225 47/32.4 |
| 2016/0031398 A1 | * | 2/2016 | Azuma | ................ H05K 5/0047 361/752 |

FOREIGN PATENT DOCUMENTS

JP    2016-030509 A    3/2016

OTHER PUBLICATIONS

Fmb, 4" Metal Extension Bracket for Extra Projection and Side Mounting Blin, Dec. 3, 2019, FixMyBlinds, https://fixmyblinds.com/products/extension-bracket-4 (Year: 2019).*

* cited by examiner

*Primary Examiner* — Rockshana D Chowdhury
*Assistant Examiner* — Martin Antonio Asmat Uceda
(74) *Attorney, Agent, or Firm* — Oliff PLC (57) ABSTRACT

A control device to be mounted on a vehicle, includes: a board; a control circuit which is provided on the board and is configured to execute a control in a case of a collision of the vehicle; a case in which the board is accommodated; and a bracket that extends from a side surface of the case and is to be fixed to the vehicle with a fastening member, and the bracket includes: a groove portion that extends in an intersection direction intersecting an extending direction of the bracket from the case; and a protrusion that closes a part of the groove portion.

14 Claims, 5 Drawing Sheets

CONTROL DEVICE

CROSS-REFERENCE TO RELATED APPLICATIONS

This application is based on and claims priority under 35 USC 119 from Japanese Patent Application No. 2021-077520 filed on Apr. 30, 2021.

TECHNICAL FIELD

The present invention relates to a control device mounted on a vehicle.

BACKGROUND ART

Conventionally, a control device that controls a safety device in the event of a vehicle collision, such as an airbag of a vehicle, has been known (e.g., see JP-A-2016-30509). In such a control device, an internal circuit board is covered with a metallic housing, and the circuit board is protected from being damaged by impact or the like.

The control device includes a case (the housing) in which the circuit board is accommodated, and a bracket that extends from a side surface of the case and is fixed to a vehicle with a fastening member. When a large force is applied to the case due to a vehicle collision or the like, the bracket and the case are fractured and separated from each other. In this way, it is possible to suppress a large load from being applied to the circuit board in the case in the event of a vehicle collision or the like, thereby preventing the damage of the circuit board. Since the damage of the circuit board is prevented, it is possible to properly operate an airbag in the event of a collision and to collect the operation record of the airbag after the collision.

SUMMARY OF INVENTION

In the housing that controls the safety device in the event of a vehicle collision or the like, when rigidity of the housing is too high, in the event of a vehicle collision or the like, the case and the bracket cannot be properly separated, and there is a concern that a large load is applied to the circuit board. On the other hand, when rigidity of the housing is insufficient, for example, there is concern that the frequency at which the housing resonates decreases and the housing is likely to vibrate due to the resonance.

In view of the above situations, an object of the present invention is to provide a technique capable of appropriately protecting a board arranged inside a case of a control device.

An exemplary control device of the present invention is a control device to be mounted on a vehicle, including: a board; a control circuit which is provided on the board and is configured to execute a control in a case of a collision of the vehicle; a case in which the board is accommodated; and a bracket that extends from a side surface of the case and is to be fixed to the vehicle with a fastening member, wherein the bracket includes: a groove portion that extends in an intersection direction intersecting an extending direction of the bracket from the case, and a protrusion that closes a part of the groove portion.

According to the present invention, it is possible to appropriately protect the board arranged inside the case of the control device.

DETAILED DESCRIPTION OF THE INVENTION

Hereinafter, exemplary embodiments of the present invention will be described in detail with reference to the drawings. A control device 1 according to the embodiment is mounted on a vehicle (not shown). In the drawings, the XYZ coordinate system is shown as a three-dimensional Cartesian coordinate system as appropriate. The X direction is a direction parallel to a travelling direction of a vehicle. The +X side is the front side, and the −X side is the rear side. The Y direction is orthogonal to the travelling direction of the vehicle and corresponds to the left and right direction as viewed from a driver sitting in a driver's seat. The +Y side is the right side, and the −Y side is the left side. The Z direction is a direction orthogonal to the X direction and the Y direction and corresponds to the upper and lower direction. The +Z side is the upper side, and the −Z side is the lower side. However, these directions are names used only for explanation and are not intended to limit the actual positional relationship and direction.

1. OVERVIEW OF CONTROL DEVICE

Figure 1:
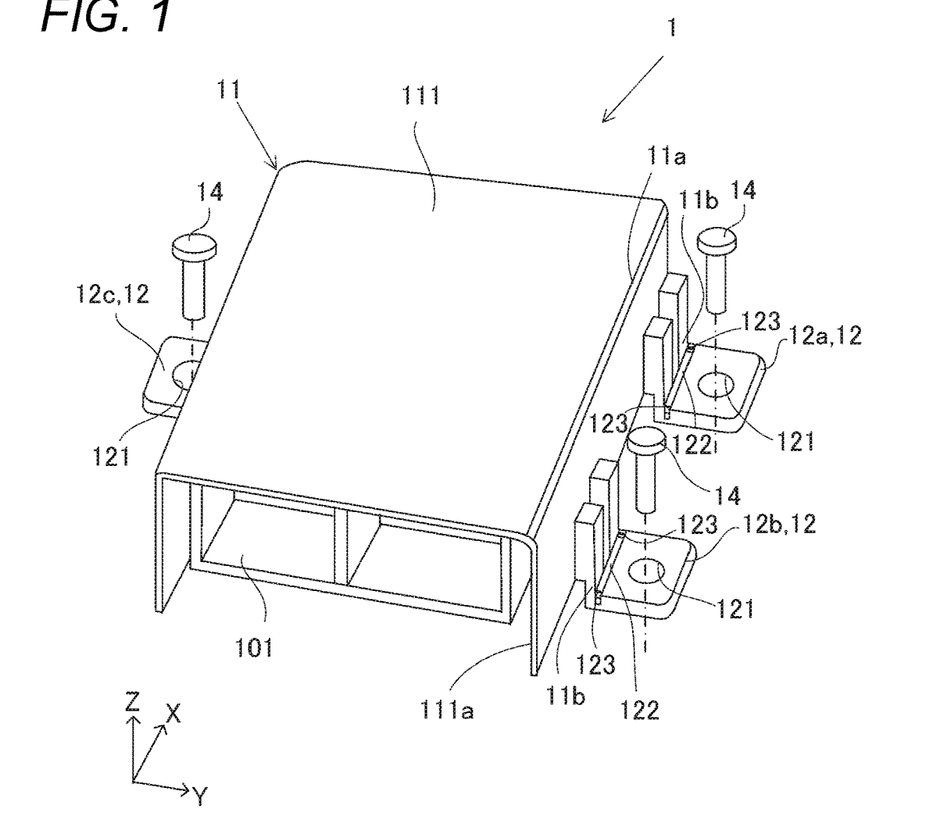
FIG. 1 is a schematic perspective view showing a configuration of a control device.

FIG. 1 is a schematic perspective view showing a configuration of the control device 1 according to the embodiment of the present invention. The control device 1 is a control device that controls a safety device in the event of a vehicle collision. In the present embodiment, the safety device is an airbag. That is, the control device 1 is, in detail, a control device that controls an airbag (not shown) of a vehicle. The control device 1 is a so-called airbag ECU (Electronic Control Unit). The control device 1 detects a vehicle collision by using, for example, a sensor arranged in front of a vehicle and activates an airbag for a driver's seat and an airbag for a passenger's seat. The control device 1 is arranged, for example, in a front central portion of a vehicle interior. The control device 1 is arranged, for example, under a center console of a vehicle.

In the present embodiment, the safety device controlled by the control device 1 is an airbag. However, the safety device may be other than an airbag. For example, the safety device may be a seatbelt pretensioner, a control device for braking or steering or the like for collision avoidance, an information recording device in the event of an accident or the like, a safety device for pedestrian protection, or the like.

Figure 2:
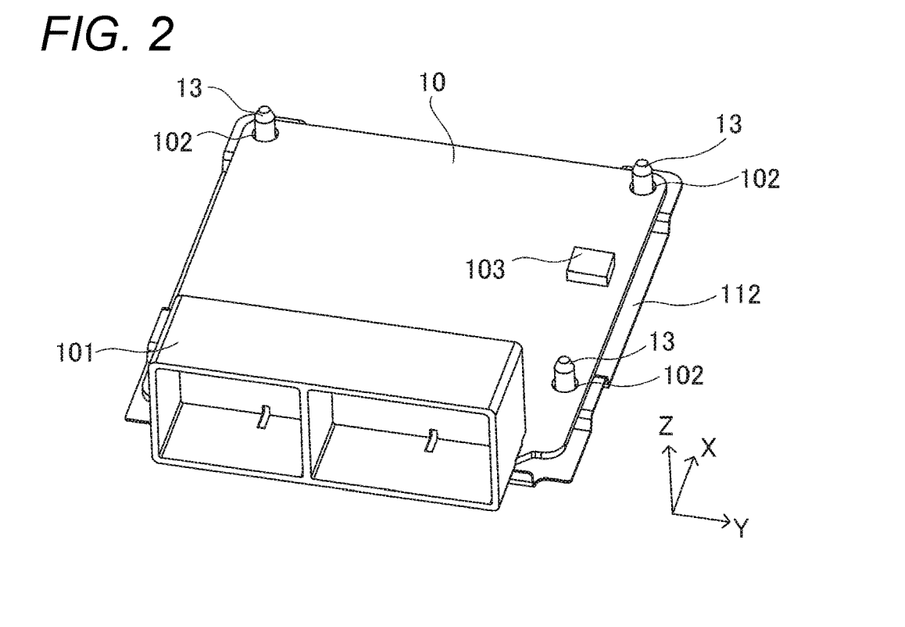
FIG. 2 is a view in which some parts are removed from the control device shown in FIG. 1.

FIG. 2 is a view in which some parts are removed from the control device 1 shown in FIG. 1. As shown in FIGS. 1 and 2, the control device 1 includes a board 10, a case 11, and brackets 12.

The board 10 is a board at which a control circuit to execute a control in the event of a vehicle collision is provided. A control circuit for controlling an airbag of a vehicle is provided at the board 10. The control circuit may include a hardware processor. Electronic components for controlling an airbag are mounted on the board 10. The electronic components include, for example, a microcomputer and the like. The board 10 is a printed board such as a glass epoxy board, for example. In the present embodiment, the board 10 has a rectangular plate shape in a plan view from above. A connector 101 is arranged behind an upper surface of the board 10. The connector 101 functions as, for example, an input unit for a signal from an external device, an output unit for a signal to an external device, and a power supply connector. The external device includes an airbag, a sensor placed in front of a vehicle, and the like.

In the present embodiment, the board 10 is provided with a sensor 103 (see FIG. 2) such as an acceleration sensor that detects an impact or vibration generated in a vehicle in order to detect a collision state or the like of a vehicle. As shown in FIG. 2, the acceleration sensor 103 is arranged, for example, near an outer edge of the board 10. For example, when the resonance frequency decreases due to insufficient rigidity of the case 11, which will be described in detail later, the resonance frequency approaches the signal frequency band of the acceleration sensor 103 (the frequency band of the signal where the waveform appears when it is in the state to be detected, such as a collision), resulting in a decrease in the accuracy of the detected signal. That is, when the resonance frequency decreases, the acceleration sensor 103 may not be able to make an accurate collision determination. The control device 1 of the present embodiment adopts a structure that suppresses a decrease in the resonance frequency as described later.

The case 11 accommodates the board 10. In the present embodiment, the case 11 is made of metal. In the present embodiment, the case 11 has an upper case 111 and a lower case 112. For example, the upper case 111 is made of a metal die cast such as an aluminum die cast. Further, for example, the lower case 112 is made of an iron-based sheet metal material. The upper case 111 and the lower case 112 may be made of different materials as in the present embodiment, but may be made of the same material. FIG. 2 is a view in which the upper case 111 is excluded from the control device 1 shown in FIG. 1. As shown in FIG. 2, the lower case 112 is a rectangular plate-shaped member in a plan view from above, and the board 10 is placed on the upper surface thereof.

The upper case 111 has a box shape having an opening at the lower side. In the present embodiment, the upper case 111 has a rear opening 111a at the rear side. The upper case 111 covers the lower case 112 on which the board 10 is placed from above. The upper case 111 and the lower case 112 are fastened by a screw 13 (see FIG. 4) extending in the upper and lower direction. The board 10 is accommodated in a space formed between the upper case 111 and the lower case 112 in the upper and lower direction. The board 10 has a board penetration hole 102 through which the screw 13 for fastening the upper case 111 and the lower case 112 is passed. The board 10 is fixed in the case 11 by fastening the upper case 111 and the lower case 112 by the screw 13 while the screw 13 is passed through the board penetration hole 102. When the board 10 is accommodated in the case 11, the connector 101 is exposed to the outside of the case 11 through the rear opening 111a of the upper case 111.

In the present embodiment, as a preferred form, the case 11 has a case body portion 11a and leg portions 11b. The case body portion 11a holds the board 10. The leg portions 11b extend downward from the case body portion 11a on the side surface of the case body portion 11a. In other words, the leg portions 11b extend downward from the case body portion 11a toward a mounting surface of a vehicle on the side surface of the case body portion 11a. Specifically, the case body portion 11a is composed of a part of the upper case 111 and the lower case 112. The case body portion 11a is a portion that mainly forms an accommodation space of the board 10. The leg portions 11b are provided on the left and right side surfaces of the case body portion 11a. In the present embodiment, the number of the leg portions 11b are three according to the number of the brackets 12 whose details will be described later. Two leg portions 11b are provided on the right side surface, and one leg portion 11b is provided on the left side surface. In the present embodiment, the leg portions 11b are configured by a part of the upper case 111.

The brackets 12 extend from the side surfaces of the case 11. Specifically, the brackets 12 extend from lower portions of the left and right side surfaces of the case 11 toward the outside of the case 11. In the present embodiment, the extending direction of the brackets 12 is a direction parallel to the left and right direction. Further, the brackets 12 are members integrated with the upper case 111. The brackets 12 extend outward in the left and right direction from lower portions of the left and right side surfaces of the upper case 111.

More specifically, each bracket 12 extends from the leg portion 11b. The bracket 12 extends from a lower end of the leg portion 11b toward the outside of the case 11 in the left and right direction. When the bracket 12 extends from the leg portion 11b, a lower surface of the case body portion 11a in which the board 10 is accommodated can be arranged at a position higher than that of the bracket 12. That is, the board 10 can be arranged at a position higher than that of the bracket 12. Therefore, for example, when the bracket 12 is fractured, the fragments generated due to the fracture can be prevented from falling on the board 10.

Each bracket 12 is fixed to the vehicle with a fastening member 14. The bracket 12 is provided to fix the case 11 accommodating the board 10 to the vehicle. In the present embodiment, the bracket 12 has a flat plate shape and is fixed to a mounting surface arranged on the vehicle by using the fastening member 14. The fastening member 14 is, for example, a bolt or a screw or the like used in combination with a nut. A bracket penetration hole 121 penetrating in the upper and lower direction is provided in a central portion of the bracket 12 so as to allow the fastening member 14 to pass therethrough.

In the present embodiment, the bracket 12 includes a first bracket 12a, a second bracket 12b, and a third bracket 12c. The first bracket 12a and the second bracket 12b extend to the right from the right side surface of the case 11. The third bracket 12c extends to the left from the left side surface of the case 11. In other words, the control device 1 includes the brackets 12a, 12b provided on one side of the case 11 in the left and right direction (the extending direction in which the bracket 12 extends from the side surface of the case 11), and the bracket 12c provided on the other side.

More specifically, the first bracket 12a extends to the right from the leg portion 11b arranged on the front side of the right side surface. The second bracket 12b extends to the right from the leg portion 11b arranged on the rear side of the right side surface. The third bracket 12c extends to the left from the leg portion 11b arranged slightly forward of the central portion of the left side surface in the front and rear direction. The position of the third bracket 12c in the front and rear direction is located on the rear side of the first bracket 12a and on the front side of the second bracket 12b.

In the present embodiment, the shapes and sizes of the first bracket 12a, the second bracket 12b, and the third bracket 12c are the same. However, the shapes and sizes of these three brackets 12a to 12c may be different. In the present embodiment, the outer shapes of the three brackets 12a to 12c are substantially rectangular in a plan view from the upper and lower direction. Specifically, a corner portion of each of the brackets 12a to 12c has an R shape. However, the shape of the bracket 12 may be appropriately changed from the shape of the present embodiment.

Further, although, in the present embodiment, the number of the brackets 12 is three, the number of the brackets 12 may be two, or four or more. For example, when the number of the brackets 12 is two, one bracket 12 may be provided on each of the right side surface and the left side surface of the case 11. Further, for example, when the number of the brackets 12 is four, two brackets 12 may be provided on each of the right side surface and the left side surfaced of the case 11. Further, the position in the front and rear direction in which the bracket 12 is arranged may be changed as appropriate.

Further, although, in the present embodiment, the direction of the control device 1 is the direction in which the brackets 12 are arranged on the left and right sides of the case 11, this is also merely an example. For example, the direction of the control device 1 may be the direction in which the brackets 12 are arranged on the front and rear sides of the case 11.

2. DETAILED CONFIGURATION OF BRACKET

The control device 1 fixed to a predetermined position of the vehicle by using the brackets 12 may receive a force from a side surface direction (the left and right direction in the present embodiment) due to deformation of the vehicle in the event of a vehicle collision. When the control device 1 of the present embodiment receives a force from the side surface direction and a certain amount of force is applied thereto, the control device 1 is fractured, and the case 11 and the brackets 12 are separated from each other. In this way, it is possible to suppress a large load from being applied to the board 10 in the case 11. Hereinafter, the structure adopted in the brackets 12 for promoting the fracture will be described in detail.

Figure 3:
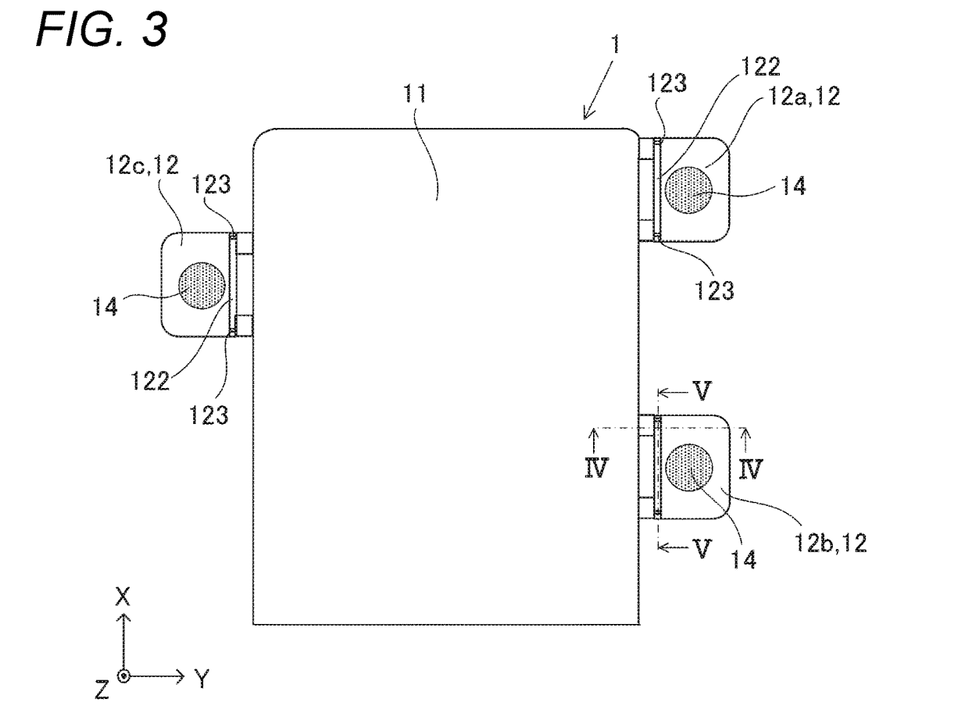
FIG. 3 is a schematic plan view showing a configuration of the control device.
Figure 4:
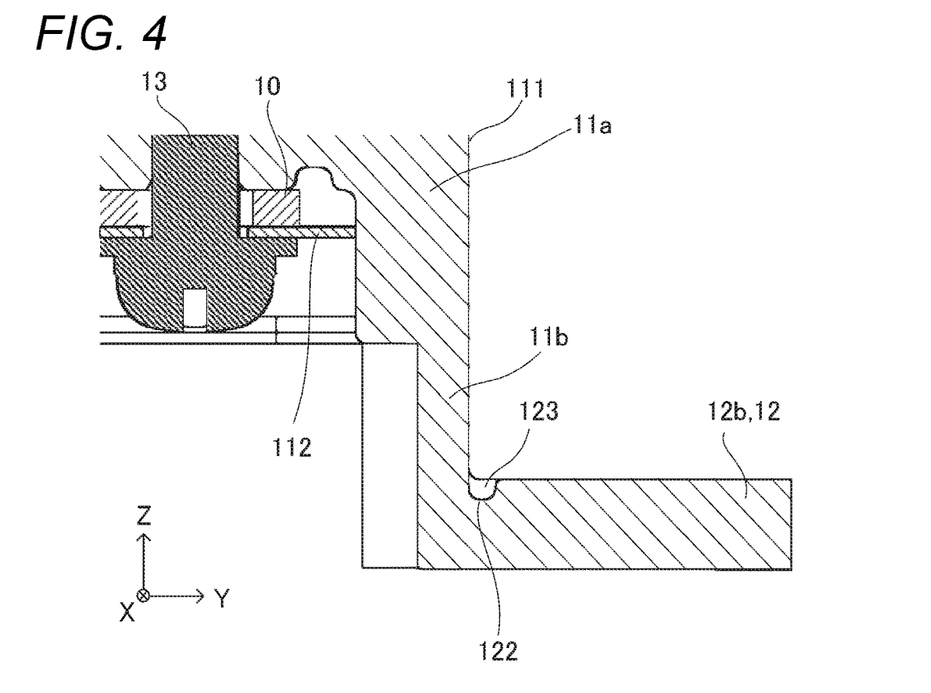
FIG. 4 is a view showing a part of a cross section at the IV-IV position shown in FIG. 3.
Figure 5:
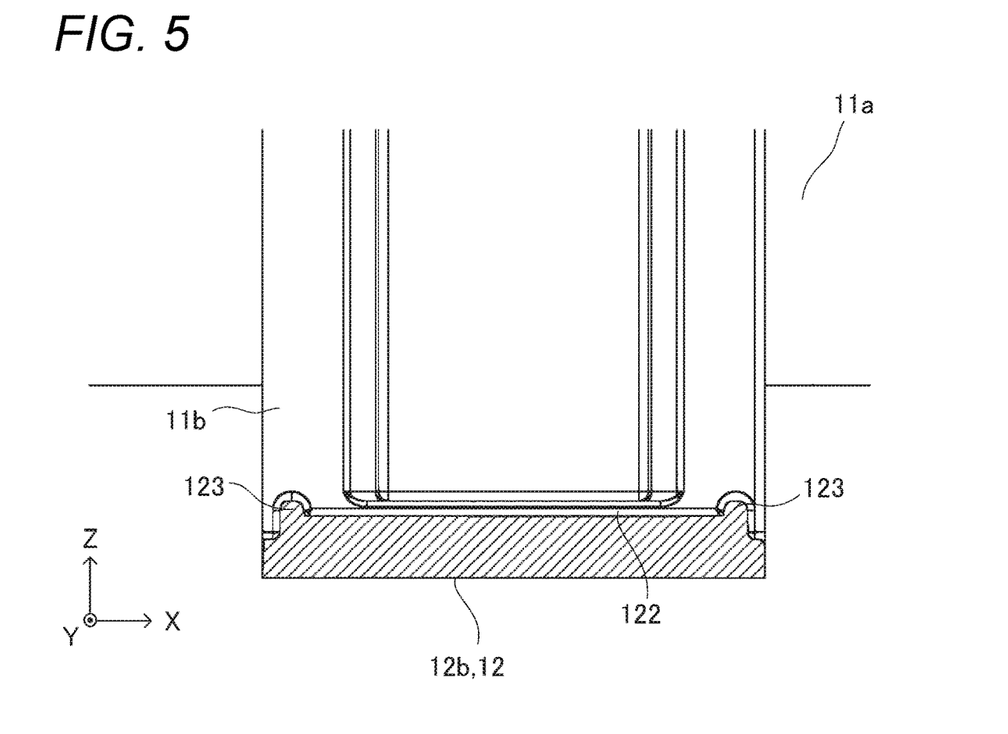
FIG. 5 is a view showing a part of a cross section at the V-V position shown in FIG. 3.

FIG. 3 is a schematic plan view showing a configuration of the control device 1 according to the embodiment of the present invention. FIG. 4 is a view showing a part of a cross section at the Iv-Iv position shown in FIG. 3. FIG. 5 is a view showing a part of a cross section at the v-v position shown in FIG. 3. In the present embodiment, the bracket 12 includes the first bracket 12a, the second bracket 12b, and the third bracket 12c. All of these three brackets 12a to 12c are provided with the structures for promoting the fracture. Although FIGS. 4 and 5 show the second bracket 12b as an example, the first bracket 12a and the third bracket 12c also have a similar structure. Therefore, in the description of the structure for promoting the fracture, the first bracket 12a, the second bracket 12b, and the third bracket 12c will be simply described as the bracket 12 without any particular distinction, unless it is particularly necessary.

As shown in FIGS. 3 to 5, the bracket 12 has a groove portion 122 arranged on an upper surface of a root portion of the bracket 12. In the present embodiment, the upper surface of the bracket 12 is a flat surface extending in a direction parallel to the front and rear direction and the left and right direction. The root portion of the bracket 12 is a portion of the bracket 12 including the boundary between the case 11 and the bracket 12.

The groove portion 122 extends in an intersection direction intersecting the extending direction of the bracket 12 from the case 11. In the present embodiment, the groove portion 122 is recessed downward. The groove portion 122 extends from one end to the other end of the bracket 12 in the intersection direction. Specifically, the groove portion 122 is a portion recessed downward from the upper surface of the bracket 12. The thickness of the bracket 12 in the upper and lower direction is thinned at the portion where the groove portion 122 is provided. In the present embodiment, the extending direction is the left and right direction, and the intersection direction intersecting the extending direction is the front and rear direction. That is, the groove portion 122 arranged on the upper surface of the bracket 12 extends in the front and rear direction. The groove portion 122 extends from a front end to a rear end of the bracket 12.

The bracket 12 has protrusions 123 that close a part of the groove portion 122. The protrusions 123 protrude from an inner surface of the groove portion 122 and at least a part thereof is arranged inside the groove portion 122. In the present embodiment, the protrusions 123 protrude upward from a bottom surface (lower surface) of the groove portion 122. Further, the protrusions 123 connect two inner surfaces of the groove portion 122 facing each other in the left and right direction.

Figure 6:
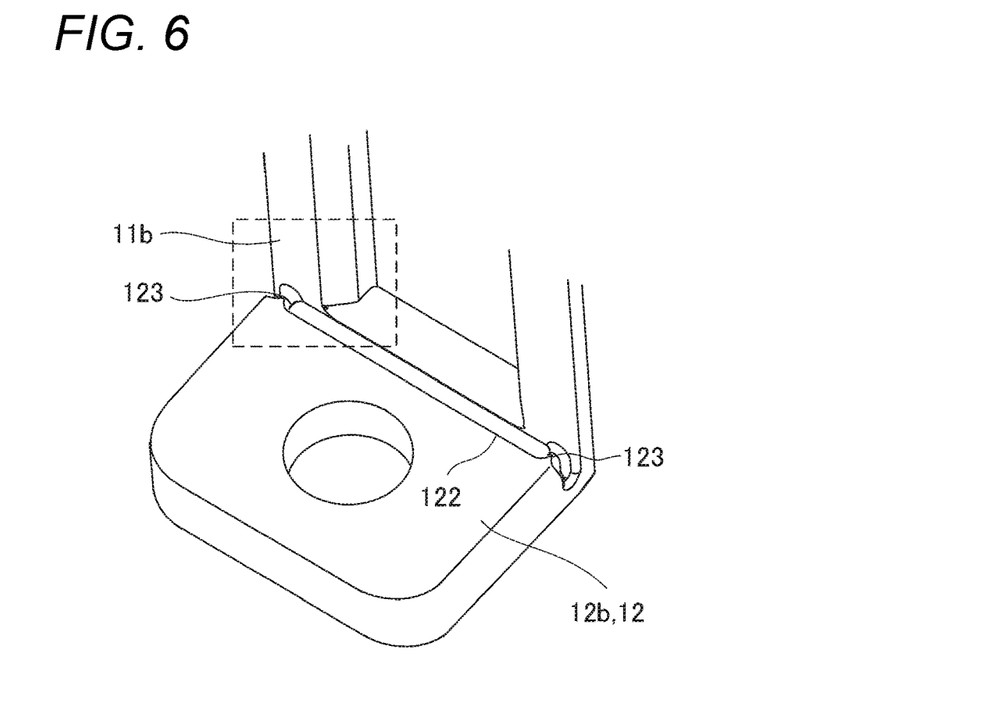
FIG. 6 is a schematic perspective view showing a bracket and a structure around the bracket.
Figure 7:
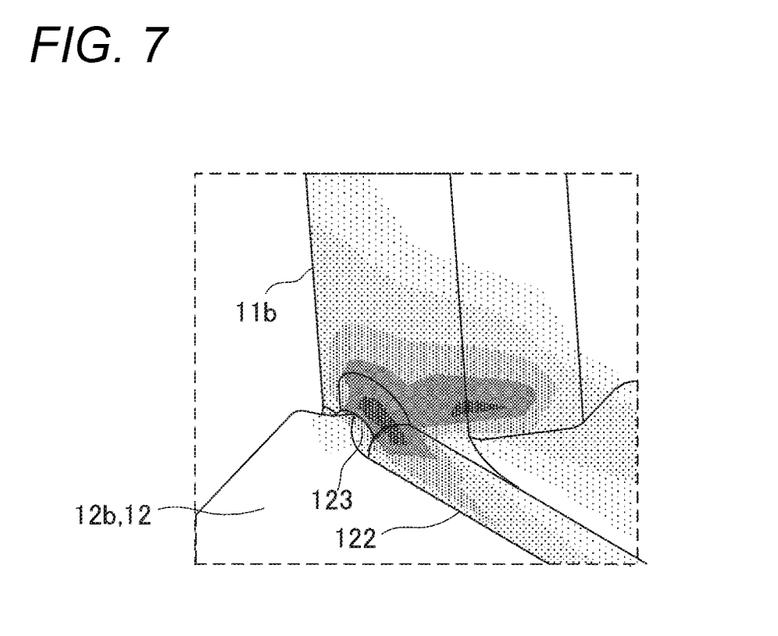
FIG. 7 is an enlarged view of a portion surrounded by a broken line in FIG. 6.

FIGS. 6 and 7 are views for explaining an operation of the protrusions 123 provided in the bracket 12. FIG. 6 is a schematic perspective view showing the bracket 12 (the second bracket 12b) and the structure around the bracket 12. FIG. 7 is an enlarged view of a portion surrounded by a broken line in FIG. 6. FIG. 7 shows the results of simulation using an analysis software. Specifically, FIG. 7 shows the simulation results of the stress distribution when a force is applied to the left from the right side surface of the case 11 of the control device 1 fixed to the vehicle by using the three brackets 12a to 12c. In FIG. 7, it is shown that the darker the hatched color, the greater the stress.

The inventors of the present application have considered that when the protrusion 123 for changing the shape of the groove portion 122 is provided in a part of the groove portion 122, stress can be easily concentrated on that part. From this consideration, the protrusion 123 was provided. In the results of the simulation shown in FIG. 7 using the analysis software, stress is large in and around the protrusion 123. That is, from the results of the simulation, it was confirmed that when the protrusion 123 is provided in a part of the groove portion 122, the fracture at the position where the groove portion 122 is provided can be promoted.

As can be seen from the above, in the present embodiment, the groove portion 122 is provided at the root portion of the bracket 12 where stress is likely to be concentrated when a force from the side surface direction (the left and right direction) is applied to the case 11 of the control device 1. That is, the thickness of the portion of the bracket 12 where stress is likely to be concentrated when a force from the side surface direction (the left and right direction) is applied to the case 11 is provided to be thin. Therefore, in the present embodiment, it is possible to easily cause a fracture that separates the case 11 and the bracket 12. In the present embodiment, the protrusion 123 for promoting stress concentration is provided in the groove portion 122, so that it is possible to promote a fracture at the position where the groove portion 122 is provided. That is, when a large force is applied to the case 11 from the side surface direction of the control device 1 due to a vehicle collision, separation of the case 11 and the bracket 12 due to the fracture can be promoted, and a large load can be suppressed from being applied to the board 10 in the case 11. That is, the board 10 in the case 11 can be appropriately protected.

In the present embodiment, since the leg portion 11b is provided in the case 11, the bracket 12 can be separated from the case 11 at a height position lower than the height position where the board 10 is provided. Therefore, there is a low possibility that the case 11 will crack at the height position where the board 10 is provided, and the possibility that the fragments generated due to the fracture come into contact with the board 10 can be suppressed to a low level. That is, in the present embodiment, the possibility that the board 10 is damaged by the fragments generated due to the fracture can be suppressed to a low level.

In the present embodiment, the vertical cross section of the protrusion 123 is substantially semicircular (see FIG. 5). However, the shape of the protrusion 123 may be another shape. For example, the vertical cross section of the protrusion 123 may have a shape that tapers upward. Further, if the range occupied by the protrusion 123 in the front and rear direction becomes too large in the groove portion 122 extending in the front and rear direction, conversely, the fracture may be less likely to be promoted. Therefore, the length (width) in the front and rear direction of the protrusion 123 in the groove portion 122 is preferably made as small as possible within a manufacturable range. For example, the length in the front and rear direction of the protrusion 123 is preferably smaller than 1/8 of the full length in the front and rear direction of the groove portion 122.

The protrusion 123 is preferably arranged in the vicinity of at least one end of both ends of the groove portion 122 in the front and rear direction (the intersection direction intersecting the extending direction of the bracket 12 from the case 11). In the portion of the bracket 12 where the groove portion 122 is provided, stress tends to be more easily concentrated on an end side in the direction in which the groove portion 122 extends. Therefore, the protrusion 123 that promotes stress concentration is preferably provided on the end side of the groove portion 122. With such a configuration, the effect of concentrating stress by providing the protrusion 123 can be obtained more efficiently.

In the present embodiment, as a more preferred form, the protrusion 123 is arranged near both ends of the groove portion 122 in the front and rear direction. That is, the number of the protrusions 123 is two. The number of the protrusions 123 may be one, or three or more. However, it is preferable that the number of the protrusions 123 is two or less.

In the present embodiment, as a preferred form, the protrusion 123 is arranged on the inner side in the front and rear direction from ends of the groove portion 122 in the front and rear direction (the intersection direction intersecting the extending direction of the bracket 12 from the case 11). However, the protrusion 123 may be arranged at the ends of the groove portion 122 in the front and rear direction. Specifically, in the vicinity of both ends of the groove portion 122 in the front and rear direction, the protrusion 123 is arranged on the inner side in the front and rear direction from the ends of the groove portion 122 in the front and rear direction. In the vicinity of a front end of the groove portion 122, the protrusion 123 is arranged at a position rearward from the front end of the groove portion 122. In the vicinity of a rear end of the groove portion 122, the protrusion 123 is arranged at a position forward from the rear end of the groove portion 122.

As shown in FIG. 5, the thickness in the upper and lower direction of the portion of the bracket 12 where the groove portion 122 is provided is thinner on the outer side in the front and rear direction than on the inner side in the front and rear direction from the protrusion 123. In other words, the depth of the groove portion 122 is deeper on the outer side in the intersection direction than on the inner side in the intersection direction (the front and rear direction) from the protrusion 123. Specifically, on the front end side of the groove portion 122 in the front and rear direction, the thickness of the bracket 12 is thinner on the front end side (the outer side) from the protrusion 123 than on the rear end side (the inner side) from the protrusion 123. In other words, on the front end side of the groove portion 122 in the front and rear direction, the depth of the groove portion 122 is deeper on the front end side (the outer side) than on the rear end side (the inner side) from the protrusion 123. On the rear end side of the groove portion 122 in the front and rear direction, the thickness of the bracket 12 is thinner on the rear end side (the outer side) from the protrusion 123 than on the front end side (the inner side) from the protrusion 123. In other words, on the rear end side of the groove portion 122 in the front and rear direction, the depth of the groove portion 122 is deeper on the rear end side (the outer side) than on the front end side (the inner side) from the protrusion 123.

In this way, assuming that the thickness in the upper and lower direction of the portion of the bracket 12 where the groove portion 122 is provided is made thinner at the ends in the front and rear direction, fracture can be easily promoted at the position where the groove portion 122 is provided when a force is applied to the case 11 from an oblique direction (a direction tilted with respect to the left and right direction). Other configurations may be adopted in which the thickness in the upper and lower direction of the portion of the bracket 12 where the groove portion 122 is provided is the same for the inner side in the front and rear direction and the outer side in the front and rear direction with reference to the protrusion 123.

Preferably, at least a part of the upper surface of the protrusion 123 is at the same height as the upper end of the groove portion 122 or lower than the upper end of the groove portion 122. In the present embodiment, the protrusion 123 is provided to protrude from a bottom of the groove portion 122 toward an entrance of the groove portion 122. Preferably, a protruding end of the protrusion 123 is at the same height as the entrance portion of the groove portion 122 or at a height lower than the entrance portion of the groove portion 122. With such a configuration, it is possible to reduce the possibility that the protrusion 123 becomes an obstacle when the bracket 12 is attached to a mounting surface (not shown) of the vehicle. Further, when at least a part of the upper surface of the protrusion 123 is set to the same height as the upper end of the groove portion 122, it is possible to suppress the occurrence of unevenness due to the provision of the protrusion 123 and facilitate manufacturing such as casting.

The entrance portion of the groove portion 122 corresponds to an opening surface located on the side opposite to a bottom surface of the groove portion 122 in a direction parallel to the direction in which the groove portion 122 having a concave cross section is recessed. In the present embodiment, "the entrance portion of the groove portion 122" corresponds to "the upper end (upper end opening surface) of the groove portion 122". Further, "protruding from the bottom of the groove portion 122 toward the entrance of the groove portion 122" corresponds to "protruding upward". Further, "the protruding end of the protrusion 123" corresponds to "the upper end of the protrusion 123".

Specifically, in the present embodiment, the upper end (the entrance portion) of the groove portion 122 is at the same height position as the upper surface of the bracket 12. Further, in the present embodiment, as shown in FIG. 4, the upper surface of the protrusion 123 is, for the most part, at the same height as the upper end of the groove portion 122. However, the protrusion 123 is made higher than the upper end of the groove portion 122 in an end (a left end in the example shown in FIG. 4) on the root side of the bracket 12.

3. DETAILED CONFIGURATION OF LEG PORTION

In the present embodiment, the brackets 12a, 12b are provided on the right side of the case 11, and the bracket 12c is provided on the left side. In such a configuration, when a force is applied from the right side of the case 11, the brackets 12a, 12b on the right side are easily fractured and easily separated from the case 11 owing to the effect obtained by providing the groove portion 122 and the protrusion 123 described above. On the other hand, when a force is applied from the right side of the case 11, the effect obtained by providing the groove portion 122 and the protrusion 123 is smaller on the bracket 12c on the left side than on the brackets 12a, 12b on the right side. That is, when a force is applied to the right side of the case 11, the bracket 12c on the left side tends to be less likely to be fractured and separated from the case 11, as compared with the brackets 12a, 12b on the right side.

Similarly, when a force is applied from the left side of the case 11, the bracket 12c on the left side is easily fractured and easily separated from the case 11. On the other hand, when a force is applied from the left side of the case 11, the brackets 12a, 12b on the right side tends to be less likely to be fractured and separated from the case 11, as compared with the bracket 12c on the left side.

Figure 8:
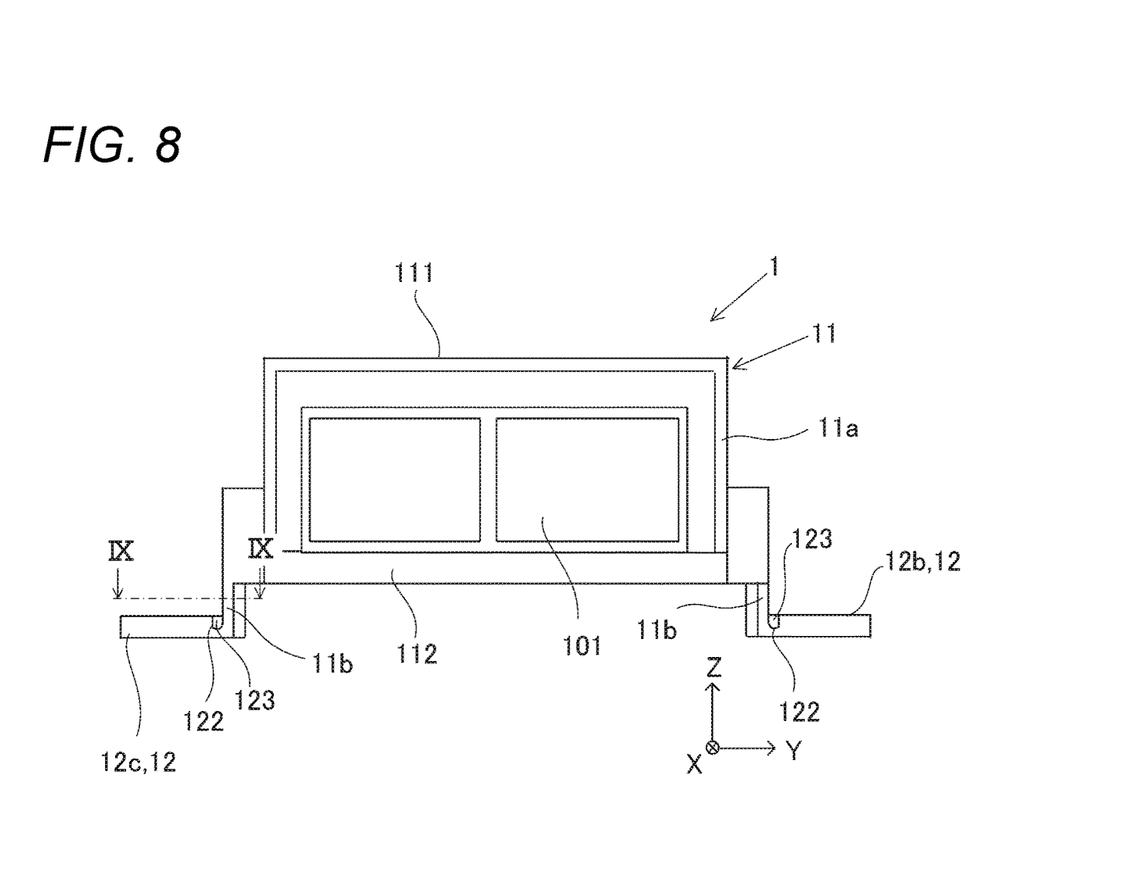
FIG. 8 is a schematic rear view showing a configuration of the control device.
Figure 9:
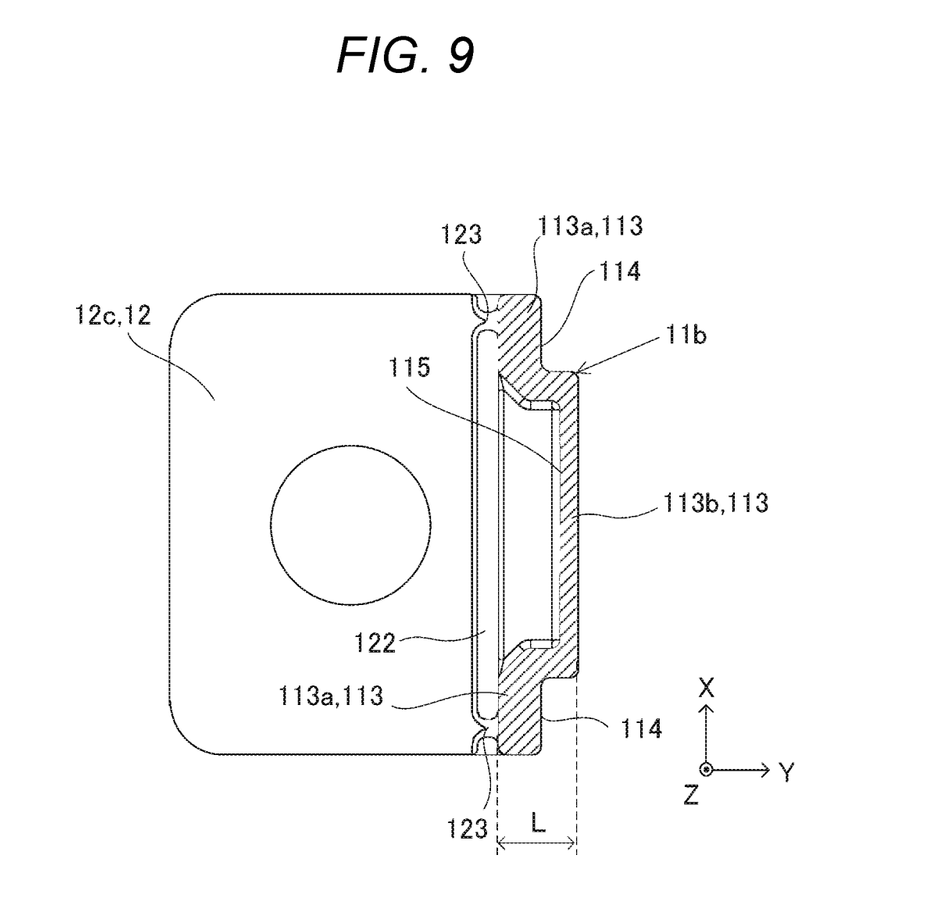
FIG. 9 is a view showing a cross section at the IX-IX position shown in FIG. 8.

In consideration of the above situations, in the present embodiment, the shape of the leg portion 11b has been devised. This will be described with reference to FIGS. 8 and 9. FIG. 8 is a schematic rear view showing a configuration of the control device 1 according to the embodiment of the present invention. FIG. 9 is a view showing a cross section at the IX-IX position shown in FIG. 8. In the present embodiment, three leg portions 11b are provided. All of the three leg portions 11b have the same structure. That is, although FIG. 9 illustrates the case of the leg portion 11b connected to the third bracket 12c, the leg portion 11b connected to the first bracket 12a and the leg portion 11b connected to the third bracket 12c also have the same structure.

As shown in FIGS. 8 and 9, on the upper side of the bracket 12, the leg portion 11b has a thin-walled portion 113 whose thickness is thinner than the width of the leg portion 11b in the left and right direction (the extending direction of the bracket 12 from the side surface of the case 11). In other words, on the side of the case body portion 11a closer than the bracket 12, the leg portion 11b has the thin-walled portion 113 whose thickness is thinner than the width of the leg portion 11b in the left and right direction (the extending direction of the bracket 12 from the side surface of the case 11). Specifically, the width of the leg portion 11b in the left and right direction is the distance between the rightmost end and the leftmost end of the leg portion 11b in the left and right direction (distance L in FIG. 9).

When the thin-walled portion 113 is formed on the leg portion 11b in this way, the leg portion 11b can be easily fractured when a force is applied to the side of the case opposite to the side on which the leg portion 11b is provided in the left and right direction. That is, the case 11 and the bracket 12 can be easily separated from each other, and the possibility that the board 10 accommodated in the case 11 is damaged can be reduced. Further, since the leg portion 11b is provided at a position lower than the board 10 accommodated in the case body portion 11a, the possibility that the fragments generated due to the fracture come into contact with the board 10 can be suppressed to a low level even when the leg portion 11b is fractured. That is, in the present embodiment, even when the leg portion 11b is fractured, the possibility that the board 10 is damaged by the fragments generated due to the fracture can be suppressed to a low level.

Specifically, the thin-walled portion 113 has a first thin-walled portion 113a and a second thin-walled portion 113b. The first thin-walled portion 113a is configured by providing cut-out portions 114 on inward surfaces in the left and right direction (the extending direction of the bracket 12) at both ends of the leg portion 11b in the front and rear direction (the intersection direction intersecting the extending direction of the bracket 12). With reference to the leg portion 11b, the direction in which the bracket 12 extends is outward, and the opposite direction thereof is inward. Specifically, the inward surface in the left and right direction of each of the leg portions 11b connected to the first bracket 12a and the second bracket 12b is the left side surface of the leg portion 11b. The inward surface in the left and right direction of the leg portion 11b connected to the third bracket 12c is the right side surface of the leg portion 11b. In the example shown in FIG. 9, the right side surfaces of the front end and the rear end of the leg portion 11b are cut-out to form the first thin-walled portion 113a.

The second thin-walled portion 113b is configured by providing a recessed portion 115 on an outward surface in the left and right direction (the extending direction of the bracket 12) at a central portion of the leg portion 11b in the front and rear direction (the intersection direction intersecting the extending direction of the bracket 12). Specifically, the outward surface in the left and right direction of each of the leg portions 11b connected to the first bracket 12a and the second bracket 12b is the right side surface of the leg portion 11b. The outward surface in the left and right direction of the leg portion 11b connected to the third bracket 12c is the left side surface of the leg portion 11b. In the example shown in FIG. 9, the left side surfaces of the central portion of the leg portion 11b in the front and rear direction is recessed to the right to form the second thin-walled portion 113b.

As in the present embodiment, the first thin-walled portion 113a is provided by cutting out both ends of the leg portion 11b in the front and rear direction to form a stepped shape. When the stepped shape is formed, stress is concentrated on the first thin-walled portion 113a and fracture can be promoted. Further, the second thin-walled portion 113b of the leg portion 11b having a thin width is provided by recessing the central portion of the leg portion 11b in the front and rear direction, so that the rigidity of the second thin-walled portion 113b is lowered and fracture can easily occur.

In the control device 1 of the present embodiment, due to a change in a mounting location of the case 11 to the vehicle, a change in a vehicle body structure of a vehicle, or the like, the distance (the distance in the upper and lower direction) between the case body portion 11a and the mounting surface of the bracket 12 is larger than that in the conventional case. That is, the leg portion 11b is larger than that in the conventional case. In such a configuration, when the leg portion 11b is simply formed into a thin plate shape so that fracture can easily occur, a decrease in resonance frequency due to a decrease in rigidity may become a problem. As described above, when the resonance frequency decreases, for example, the acceleration sensor 103 may not be able to make an accurate collision determination. On the other hand, when the thickness in the vicinity of the leg portion 11b is increased in order to suppress a decrease in rigidity, fracture may be less likely to occur.

In this regard, in the present embodiment, rather than simply reducing or increasing the thickness of the leg portion 11b, as described above, a thick portion and a thin portion are provided at appropriate positions on the leg portion 11b. With such a configuration, in a normal state, rigidity is secured to prevent resonance at a low frequency. When a vehicle collision occurs, fracture for separating the case 11 and the bracket 12 can easily occur.

4. CONSIDERATIONS

Various technical features disclosed herein can be modified in various ways in addition to the above embodiments without departing from the gist of the technical creation. That is, the above embodiments should be considered as exemplary in all respects and not restrictive. The technical scope of the present invention is defined by the claims rather than the description of the above embodiments, and it should be understood that all modifications that fall within the meaning and scope equivalent to the claims are included. Further, a plurality of embodiments and modifications described herein may be implemented in appropriate combinations to the extent possible.

What is claimed is:

1. A control device to be mounted on a vehicle, comprising:
   a board;
   a control circuit which is provided on the board and is configured to execute a control in a case of a collision of the vehicle;
   a case in which the board is accommodated; and
   a first bracket that extends from a side surface of the case and is to be fixed to the vehicle with a fastening member,
   wherein the first bracket comprises:
      a groove portion that extends in an intersection direction intersecting an extending direction of the first bracket from the case; and
      a protrusion that is arranged at an inner side in the intersection direction from an end of the groove portion in the intersection direction, and closes a part of the groove portion, and
   a depth of the groove portion is deeper at an outer side of the groove portion in the intersection direction than at an inner side of the groove portion in the intersection direction from the protrusion.

2. The control device according to claim 1, wherein the protrusion is arranged in vicinity of at least one of both ends of the groove portion in the intersection direction.

3. The control device according to claim 1, wherein the protrusion is provided to protrude from a bottom of the groove portion toward an entrance portion of the groove portion, and
   a protruding end of the protrusion is at a same height as the entrance portion of the groove portion or at a height lower than the entrance portion.

4. The control device according to claim 2, wherein the protrusion is provided to protrude from a bottom of the groove portion toward an entrance portion of the groove portion, and
   a protruding end of the protrusion is at a same height as the entrance portion of the groove portion or at a height lower than the entrance portion.

5. The control device according to claim 1, wherein the case comprises:
   a case body portion that holds the board, and
   a leg portion, of one or more leg portions, that extends from the case body portion toward a mounting surface of the vehicle at a side surface of the case body portion, and
   the first bracket extends from the leg portion.

6. The control device according to claim 2, wherein the case comprises:
   a case body portion that holds the board; and
   a leg portion, of one or more leg portions, that extends from the case body portion toward a mounting surface of the vehicle at a side surface of the case body portion, and
   the first bracket extends from the leg portion.

7. The control device according to claim 3, wherein the case comprises:
   a case body portion that holds the board; and
   a leg portion, of one or more leg portions, that extends from the case body portion toward a mounting surface of the vehicle at a side surface of the case body portion, and
   the first bracket extends from the leg portion.

8. The control device according to claim 4, wherein the case comprises:
   a case body portion that holds the board; and
   a leg portion, of one or more leg portions, that extends from the case body portion toward a mounting surface of the vehicle at a side surface of the case body portion, and
   the first bracket extends from the leg portion.

9. The control device according to claim 5,
   comprising: the first bracket provided on one side of the case in the extending direction;
   and a second bracket provided on other side of the case in the extending direction,
   wherein the one or more leg portions have a thin-walled portion, at a side closer to the case body portion than the first bracket and the second bracket, and a width of the thin-walled portion is thinner than a width of the leg portion in the extending direction.

10. The control device according to claim 6,
    comprising: the first bracket provided on one side of the case in the extending direction;
    and a second bracket provided on other side of the case in the extending direction,
    wherein the one or more leg portions have a thin-walled portion, at a side closer to the case body portion than the first bracket and the second bracket, and a width of the thin-walled portion is thinner than a width of the leg portion in the extending direction.

11. The control device according to claim 7,
comprising: the first bracket provided on one side of the case in the extending direction;
and a second bracket provided on other side of the case in the extending direction,
wherein the one or more leg portions have a thin-walled portion, at a side closer to the case body portion than the first bracket and the second bracket, and a width of the thin-walled portion is thinner than a width of the leg portion in the extending direction.

12. The control device according to claim 1, wherein an acceleration sensor is provided at the board.

13. The control device according to claim 2, wherein an acceleration sensor is provided at the board.

14. The control device according to claim 3, wherein an acceleration sensor is provided at the board.

\* \* \* \* \*